US006385166B1

(12) United States Patent
Takagi et al.

(10) Patent No.: US 6,385,166 B1
(45) Date of Patent: May 7, 2002

(54) MULTIPLEX COMMUNICATION SYSTEM

(75) Inventors: Nobutomo Takagi, Okazaki; Yasushi Kanda, Kariya; Akihiro Sasaki, Anjo; Tomohisa Kishigami, Oobu; Akihiro Tanaka, Anjo; Hiroshi Honda, Okazaki; Masato Kume, Toyota; Kazunori Sakai, Aichi-ken, all of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/121,256

(22) Filed: Jul. 23, 1998

(30) Foreign Application Priority Data

Jul. 23, 1997 (JP) ........................................ 9-197055

(51) Int. Cl.[7] ........................ G01R 31/08; G08C 15/00

(52) U.S. Cl. ........................ 370/222; 370/242; 307/85; 307/10.1

(58) Field of Search ................................ 370/217, 216, 370/221, 222, 242, 245, 247, 248, 421, 445, 464, 424, 431; 307/85, 86, 116, 10.4, 36–39, 42; 701/36, 49

(56) References Cited

U.S. PATENT DOCUMENTS

| | | | | | |
|---|---|---|---|---|---|
| 4,406,007 | A | * | 9/1983 | Kister et al. | 370/85 |
| 5,161,151 | A | * | 11/1992 | Kimura et al. | 370/13 |
| 5,774,817 | A | * | 6/1998 | Takagi et al. | 701/1 |

FOREIGN PATENT DOCUMENTS

| | | |
|---|---|---|
| JP | 54-139419 | 10/1979 |
| JP | 63-67842 | 3/1988 |
| JP | 64-47145 | 2/1989 |
| JP | 2-10935 | 1/1990 |
| JP | 6-30477 | 2/1994 |

* cited by examiner

*Primary Examiner*—Alpus H. Hsu
*Assistant Examiner*—Duc Ho
(74) *Attorney, Agent, or Firm*—Pillsbury Winthrop LLP

(57) ABSTRACT

In a multiplex communication system, a communication bus is connected to a communication bus disconnect control device. In the communication bus disconnect control device, a control section generates a communication bus disconnect signal when a trouble of the communication bus is detected. A communication bus disconnect device is provided for separating the communication bus into at least two communication bus groups in response to the communication bus disconnect signal.

12 Claims, 9 Drawing Sheets

MULTIPLEX COMMUNICATION SYSTEM

BACKGROUND OF THE INVENTION

The present invention relates to a multiplex communication system preferably installed in an automotive vehicle, and more particularly to a multiplex communication system comprising a communication bus and various measuring and/or controlling devices, such as a meter device and a door ECU, provided as nodes branching from the communication bus.

Conventionally, the multiplex communication (e.g., LAN) system is used in an automotive vehicle to connect many electronic devices to realize advanced and complicated controls through data communications between them.

However, such an integrated communication system has a weak point that even a small trouble caused in the communication bus may give adverse influence to many of the electronic devices or disable the data communication.

SUMMARY OF THE INVENTION

In view of the problems encountered in the prior art, an object of the present invention is to provide a multiplex communication system capable of suppressing the influence of the trouble caused in the communication bus.

In order to accomplish this and other related objects, an aspect of the present invention provides a multiplex communication system comprising a communication bus, and at least one communication bus disconnect control device connected to the communication bus. The communication bus disconnect control device comprises a control means for generating a communication bus disconnect signal when a trouble of the communication bus is detected. A communication bus disconnect means is provided for separating the communication bus into at least two communication bus groups in response to the communication bus disconnect signal.

Preferably, the communication bus is constituted by a plurality of separable communication bus groups. The communication bus disconnect means selectively disconnects at least one of the plurality of separable communication bus groups in response to the communication bus disconnect signal.

Preferably, the communication bus disconnect means selectively disconnects a specific communication bus group in response to the communication bus disconnect signal when the specific communication bus group causes a trouble.

Each of the plurality of separable communication bus groups may be arranged in a ring pattern Preferably, at least one of the plurality of separable communication bus groups is an instrument panel communication bus group including a node connected to a measuring and/or controlling device provided on an instrument panel of an automotive vehicle. At least one of the plurality of separable communication bus groups is a door communication bus group including a node connected to a measuring and/or controlling device installed in a door of the automotive vehicle. The communication bus disconnect means separates the instrument panel communication bus group and the door communication bus group from each other in response to the communication bus disconnect signal.

Preferably, the communication bus disconnect control device comprises a communication bus monitor means for monitoring a condition of the communication bus. The control means stops the operation of the communication bus disconnect means when no abnormality of the communication bus is confirmed by the communication bus monitor means.

Furthermore, it is preferable to provide the communication bus monitor means in a designated one selected from the plurality of communication bus disconnect control devices. In this case, the control means of the designated communication bus disconnect control device stops the operation of the corresponding communication bus disconnect means when no abnormality of the communication bus is confirmed by the communication bus monitor means, and generates a notification signal. The control means of other communication bus disconnect control device stops the operation of the corresponding communication bus disconnect means in response to the notification signal sent from the control means of the designated communication bus disconnect control device.

Alternatively, it is preferable that the control means of other communication bus disconnect control device stops the operation of the corresponding communication bus disconnect means based on an analysis on communication signals transmitted from the communication bus.

Moreover, it is preferable that the communication bus monitor means starts monitoring the communication bus upon activation of the communication bus disconnect means.

Another aspect of the present invention provides a multiplex communication system comprising a first communication bus connecting a first node group and a second communication bus connecting a second node group. A communication line is provided to directly connect the first communication bus and the second communication bus. A driver receiver is connected between the communication line and a control section for transmitting a communication signal from the first or second communication bus to the control section. A communication bus disconnect means is provided for disconnecting the communication bus connected to at least one of first and second connecting portions. The first connecting portion connects the communication line and the first communication bus. The second connecting portion connects the communication line and the second communication bus. The control section generates a communication bus disconnect signal when a trouble of the first or second communication bus is detected. The communication bus disconnect means disconnects the troubled communication bus from the communication line at the first or second connecting portion in response to the communication bus disconnect signal.

BRIEF DESCRIPTION OF THE DRAWINGS

The above and other objects, features and advantages of the present invention will become more apparent from the following detailed description which is to be read in conjunction with the accompanying drawings, in which.

DESCRIPTION OF THE PREFERRED EMBODIMENTS

Figure 1:
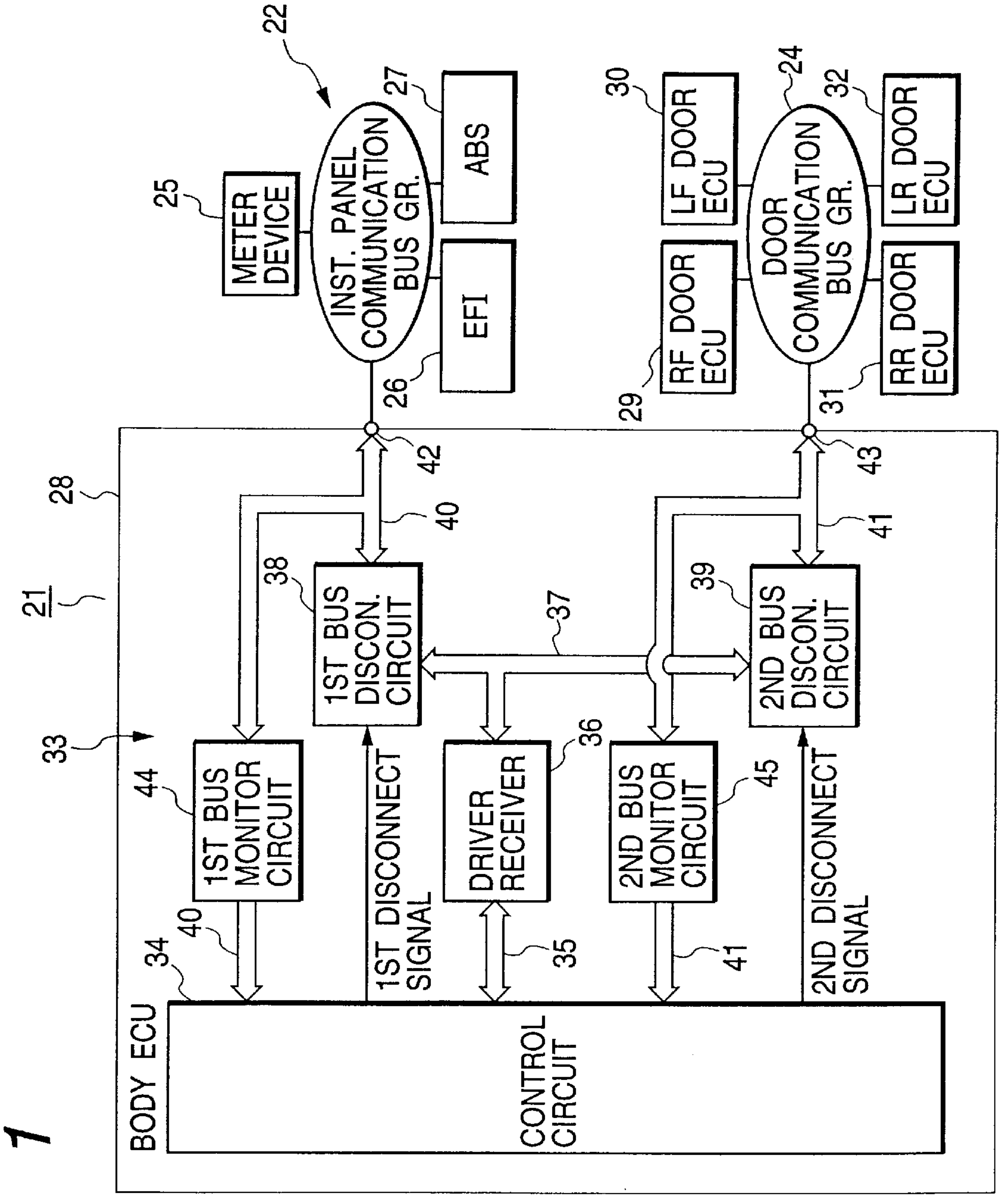
FIG. 1 is a block diagram showing an overall arrangement of a multiplex communication system in accordance with a first embodiment of the present invention.

Preferred embodiments of the present invention will be explained hereinafter with reference to attached drawings. Identical parts are denoted by the same reference numerals throughout the views.

First Embodiment

Figure 2:
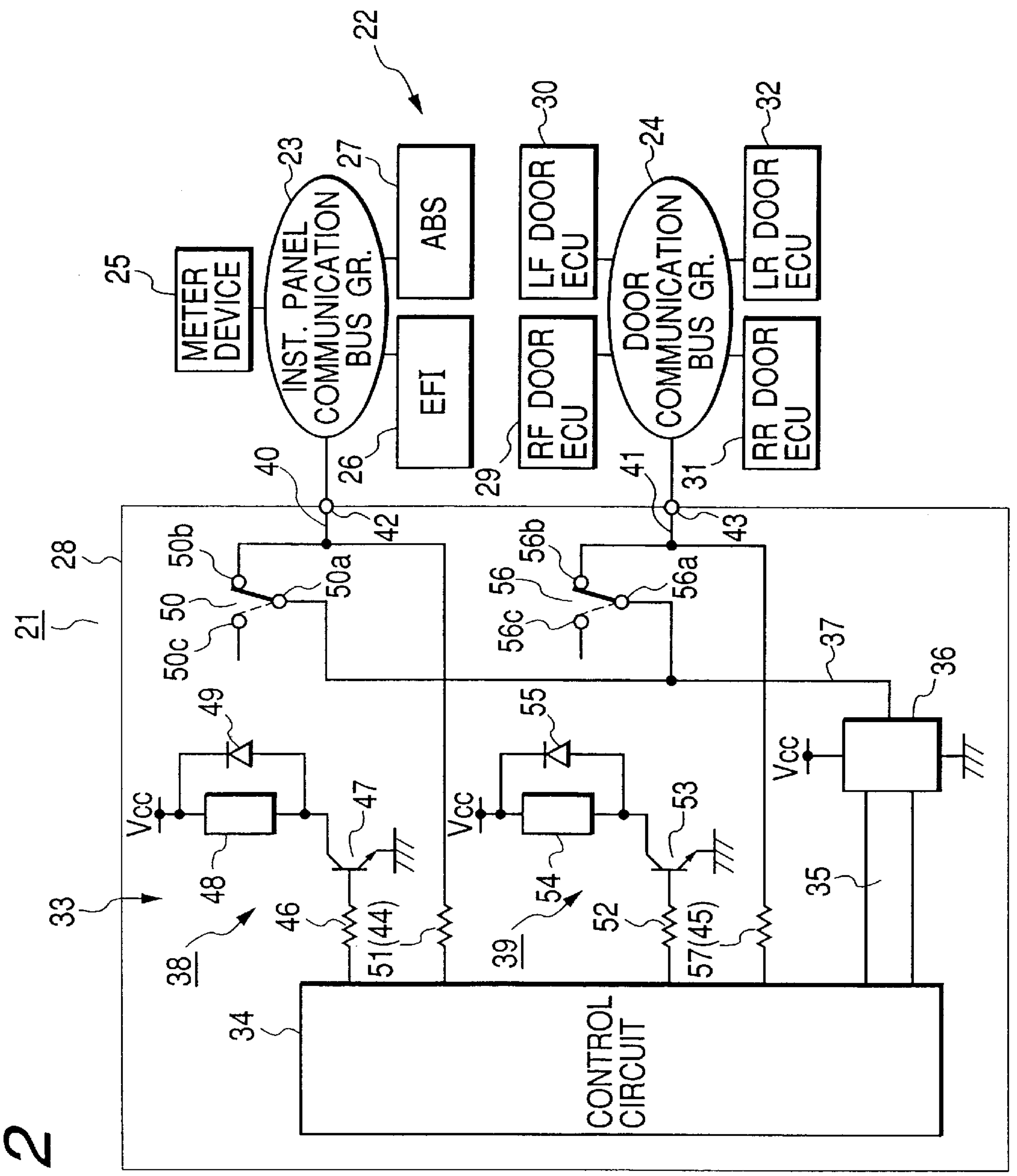
FIG. 2 is a circuit diagram showing a detailed circuit arrangement of the multiplex communication system in accordance with the first embodiment of the present invention.
Figure 3:
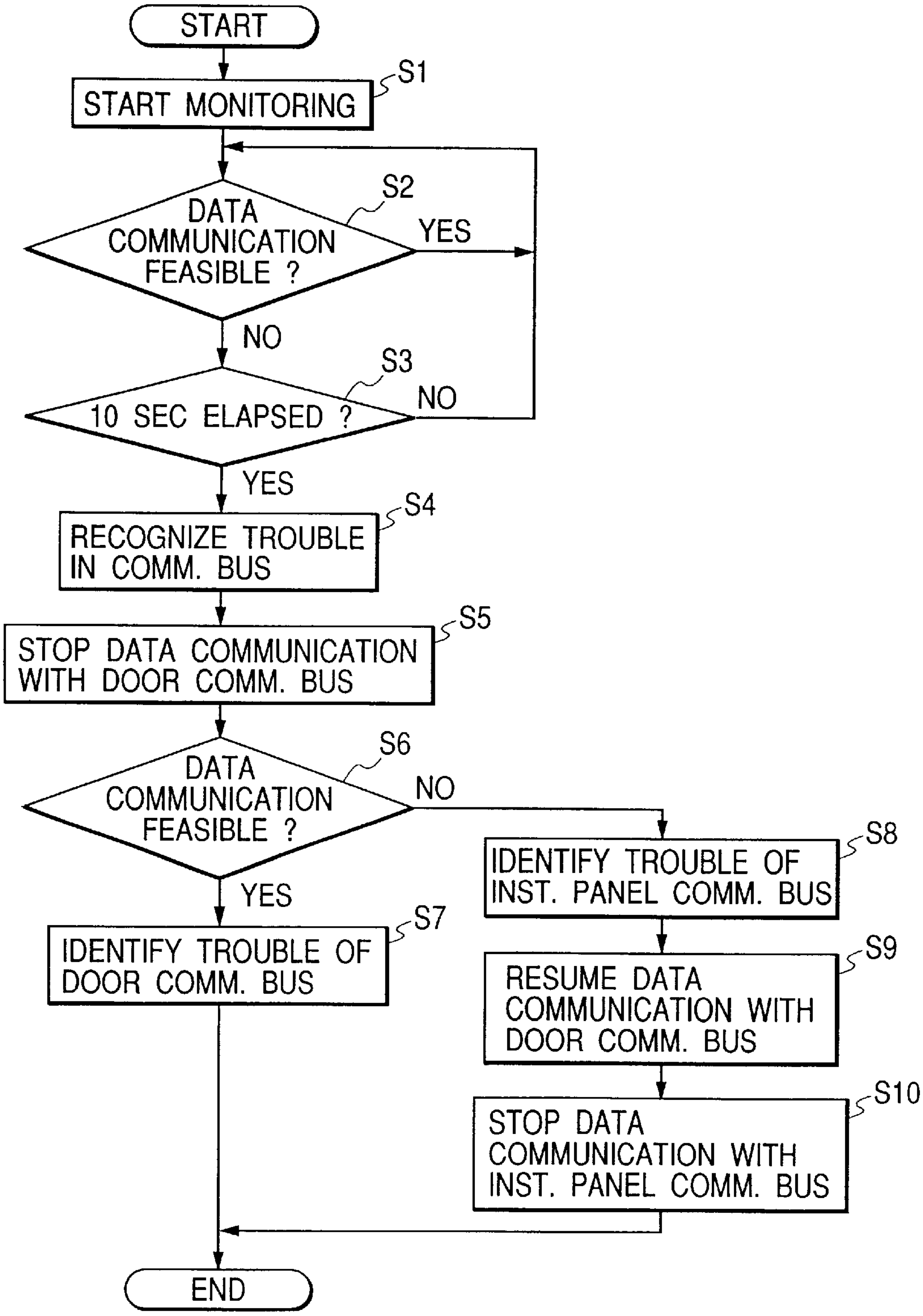
FIG. 3 is a flowchart showing an operation of the multiplex communication system in accordance with the first embodiment of the present invention.

FIGS. 1 to 3 are views showing a multiplex communication system installed in an automotive vehicle in accordance with a first embodiment of the present invention.

FIG. 1 shows an overall block diagram of the multiplex communication system, wherein a multiplex communication apparatus 21 comprises a communication bus 22 comprising a plurality of separable communication bus groups each arranged in a ring pattern. One communication bus group shown in FIG. 1 is an instrument panel communication bus group 23. Another communication bus group is a door communication bus group 24. Both the instrument panel communication bus group 23 and the door communication bus group 24 are connected to a body ECU (i.e., electronic control unit) 28.

First node group devices, provided as a plurality of nodes branching from the ring patterned instrument panel communication bus group 23, are a meter device 25 serving as a measuring and/or controlling apparatus provided on an instrument panel, an EFI (i.e., electronically controlled fuel injection system) 26, and an ABS (i.e., anti-lock braking system) 27.

Second node group devices, provided as a plurality of nodes branching from the ring patterned door communication bus group 24, are a right front (i.e., RF) door ECU 29, a left front (i.e., LF) door ECU 30, a right rear (i.e., RR) door ECU 31 and a left rear (i.e., LR) door 32 each serving as a measuring and/or controlling apparatus installed in a corresponding door.

The body ECU 28 comprises a communication bus disconnect control unit 33 as shown in FIG. 1, in addition to a door control section (not shown) acting as a main component thereof. A control circuit 34, provided in the body ECU 28, is a microcomputer that controls the communication bus disconnect control unit 33 as well as the door control section.

The control circuit 34 of the communication bus disconnect control unit 33 is connected to a driver receiver 36 via a communication line 35. The driver receiver 36 is connected via a communication line 37 to a first bus disconnect circuit 38 and a second bus disconnect circuit 39 each having the capability of disconnecting the associated communication bus. The first bus disconnect circuit 38 is connected via a communication line 40 to a first bus connecting terminal 42. The first bus connecting terminal 42 is connected to the instrument panel communication bus group 23. The second bus disconnect circuit 39 is connected via a communication line 41 to a second bus connecting terminal 43. The second bus connecting terminal 43 is connected to the door communication bus group 24.

The above-described arrangement realizes the communications between the instrument panel devices and the door devices. For example, the meter device 25 can communicate with the RF door ECU 29 via the communication line 40, the first bus disconnect circuit 38, the communication line 37, the second bus disconnect circuit 39 and the communication line 41.

Furthermore, the meter device 25 can communicate with the control circuit 34 of the body ECU 28 via the communication line 40, the first bus disconnect circuit 38, the communication line 37, the driver receiver 36 and the as communication line 35. The RF door ECU 29 can communicate with the control circuit 34 of the body ECU 28 via the communication line 41, the second bus disconnect circuit 39, the communication line 37, the driver receiver 36 and the communication line 35.

A communication line branching from the communication line 40 is connected to the control circuit 34 via a first bus monitor circuit 44. Similarly, a communication line branching from the communication line 41 is connected to the control circuit 34 via a second bus monitor circuit 45. The first and second bus monitor circuits 44 and 45 monitor the associated communication buses. The control circuit 34 is connected to the first bus monitor circuit 44. Thus, the control circuit 34 receives the monitoring result of the data (i.e., communication signals) transmitted via the communication line 40 between the instrument panel communication bus group 23 and the first bus disconnect circuit 38. Furthermore, the control circuit 34 is connected to the second bus monitor circuit 45. The control circuit 34 receives the monitoring result of the data (i.e., communication signals) transmitted via the communication line 41 between the door communication bus group 24 and the second bus disconnect circuit 39.

The control circuit 34 checks the data transmitted via the communication lines 35, 40 and 41 and detects any abnormality in the checked data. When any abnormality is detected, the control circuit 34 generates a bus disconnect signal to the first bus disconnect circuit 38 or the second bus disconnect circuit 39.

FIG. 2 shows a detailed electric circuit arrangement of the communication bus disconnect control unit 33.

The first bus disconnect circuit 38 comprises a resistor 46 connected to the control circuit 34, an NPN transistor 47 having a base terminal connected to the resistor 46, a relay coil 48 connected to a collector terminal of the NPN transistor 47, a flywheel diode 49 connected in parallel to the relay coil 48, and a relay switch 50 operable in response to the activation of the relay coil 48.

The relay switch 50 has a movable contact 50*a* connected to the driver receiver 36. One stationary contact 50*b* of the relay switch 50 is connected to the instrument panel communication bus group 23 via the first bus connecting terminal 42 and is also connected to the control circuit 34 via a resistor 51 (functioning as the first bus monitor circuit 44 shown in FIG. 1). The relay switch 50 has another stationary contact 50c serving as an opened terminal. In a normal condition, the movable contact 50a is connected to the stationary contact 50b as indicated by a solid line in FIG. 2.

In the same manner, the second bus disconnect circuit 39 comprises a resistor 52 connected to the control circuit 34, an NPN transistor 53 having a base terminal connected to the resistor 52, a relay coil 54 connected to a collector terminal of the NPN transistor 53, a flywheel diode 55 connected in parallel to the relay coil 54, and a relay switch 56 operable in response to the activation of the relay coil 54.

The relay switch 56 has a movable contact 56a connected to the driver receiver 36. One stationary contact 56b of the relay switch 56 is connected to the door communication bus group 24 via the second bus connecting terminal 43 and is also connected to the control circuit 34 via a resistor 57 (functioning as the second bus monitor circuit 45 shown in FIG. 1). The relay switch 56 has another stationary contact 56c serving as an opened terminal. In a normal condition, the movable contact 56a is connected to the stationary contact 56b as indicated by a solid line. In FIG. 2, Vcc denotes a DC (direct current) power source voltage.

FIG. 3 is a flowchart showing an operation of the above-described multiplex communication apparatus.

First, electric power is supplied to the multiplex communication apparatus 21 in response to an operation of an ignition key (not shown). The control circuit 34 starts monitoring the data that are transmitted via the communication lines 35, 40 and 41 (in step S1). In a normal condition, the data transmitted via the communication lines 35, 40 and 41 are pulse signals.

It is now assumed that a trouble is caused at a certain portion in the communication bus 22. The control circuit 34 detects the trouble caused in the communication bus 22 when the pulse signals cannot be transmitted or received via any of the communication lines 35, 40 and 41 (in step S2). It is checked whether a predetermined time (e.g., 10 seconds) has elapsed in the condition that the transmission/reception of the communication data is disabled (in step S3). When the predetermined time has elapsed (i.e., YES in step 3), the control circuit 34 recognizes that a trouble arises somewhere in the communication bus 22 (in step S4). Then, the control circuit 34 starts an operation for identifying a troubled portion.

First, to stop the communications with the door communication bus group 24, the control circuit 34 generates the bus disconnect signal to activate the second bus disconnect circuit 39. More specifically, the control circuit 34 gives a base signal to the transistor 53 to energize the relay coil 54. In response to the activation of the relay coil 54, the movable contact 56a of the relay switch 56 is switched to the stationary contact 56c (shown by a dotted line) from the stationary contact 56b. With this switching operation, the control circuit 34 stops the data communications with the door communication bus group 24 (step S5).

Next, the control circuit 34 checks whether the data communication is feasible as a result of the interruption of the data communication with the door communication bus group 24 (step S6). When the data communication is feasible (i.e., YES in step S6), the control circuit 34 acknowledges that the door communication bus group 24 is troubled (step S7).

In this case, the control circuit 34 monitors the condition of the door communication bus group 24 through the bus monitor circuit 45 (i.e., resistor 57) under the condition that the troubled door communication bus group 24 is separated from the instrument panel communication bus group 23. If the door communication bus group 24 restores to the normal condition, the control circuit 34 deactivates the second bus disconnect circuit 39. More specifically, the relay coil 54 is deenergized to return the movable contact 56a to the home position (i.e., the stationary contact 56b), thereby reconnecting the restored door communication bus group 24 to the instrument panel communication bus group 23.

If the data communication is unfeasible (i.e., NO in step S6), the control circuit 34 acknowledges that the instrument panel communication bus group 23 is troubled (step S8). In this case, the control circuit 34 stops supplying the base signal to the transistor 53 to resume the data communications with the door communication bus group 24 (step S9).

Next, the control circuit 34 gives a base signal to the transistor 47 to energize the relay coil 48. In response to the activation of the relay coil 48, the movable contact 50a of the relay switch 50 is switched to the stationary contact 50c (shown by a dotted line) from the stationary contact 50b. With this switching operation, the control circuit 34 stops the data communications with the instrument panel communication bus group 23 (step S10).

In this case, the control circuit 34 monitors the condition of the instrument panel communication bus group 23 through the bus monitor circuit 44 (i.e., resistor 51) under the condition that the troubled instrument panel communication bus group 23 is separated from the door communication bus group 24. If the instrument panel communication bus group 23 restores to the normal condition, the control circuit 34 deactivates the first bus disconnect circuit 38. More specifically, the relay coil 48 is deenergized to return the movable contact 50a to the home position (i.e., the stationary contact 50b), thereby reconnecting the restored instrument panel communication bus group 23 to the door communication bus group 24.

As described above, the control circuit 34 identifies the troubled communication bus among a plurality of separable communication buses, such as the instrument panel communication bus group 23 and the door communication bus group 24. Then, the control circuit 34 selectively stops the data communication with the identified troubled communication bus while effecting the data communication with other communication bus that is normally operated.

In this manner, according to the above-described first embodiment of the present invention, the control circuit 34 sends the bus disconnect signal to the first bus disconnect circuit 38 or the second bus disconnect circuit 39 to selectively stop the data communication with the troubled communication bus. This makes it possible to maintain the data communication using the normally operated communication bus. In other words, the adverse influence of the trouble can be minimized within a smaller region. For example, the door communication bus group 24 may be troubled when the vehicle is traveling. However, according to the present invention, the troubled door communication bus group 24 is separated from the instrument panel communication bus group 23. Thus, no adverse influence is given to the meter device 25, the EFI 26 and the ABS 27 connected to the instrument panel communication bus group 23.

Furthermore, the bus monitor circuit 44 or 45 continuously monitors the condition of the communication bus 22 upon activation of the bus disconnect circuit 38 or 39. This makes it possible to quickly restore the interrupted data communication when no abnormality is confirmed in the communication bus 22.

Second Embodiment

Figure 4:
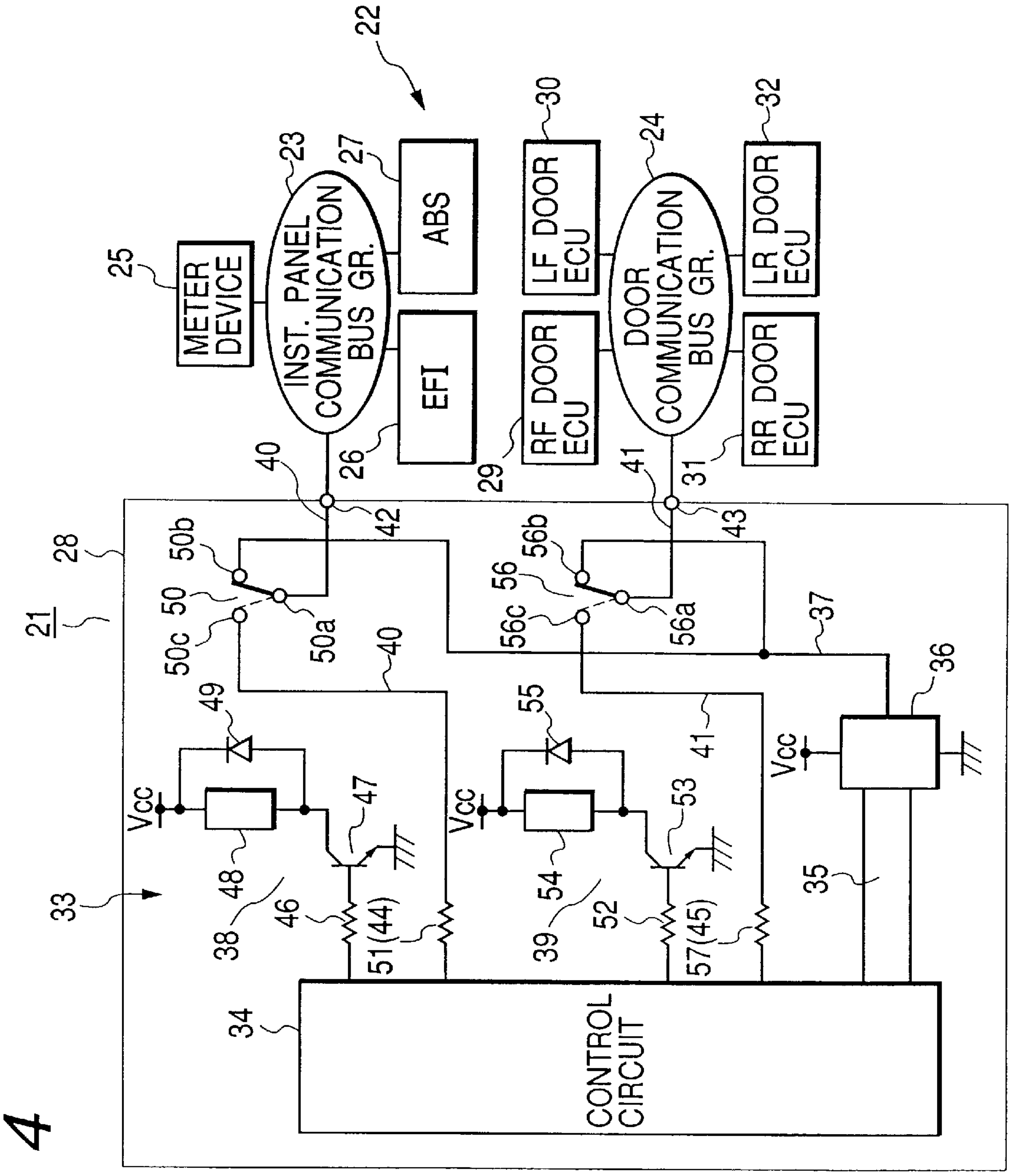
FIG. 4 is a circuit diagram showing a detailed circuit arrangement of a multiplex communication system in accordance with a second embodiment of the present invention.

FIG. 4 shows a multiplex communication system in accordance with a second embodiment of the present invention.

The second embodiment differs from the first embodiment in that the movable contact 50*a* of the relay switch 50 is connected to the first bus connecting terminal 42. The stationary contact 50*b* is connected to the driver receiver 36. The stationary contact 50*c* is connected to the control circuit 34 via the resistor 51. Similarly, the movable contact 56*a* of the relay switch 56 is connected to the second bus connecting terminal 43. The stationary contact 56*b* is connected to the driver receiver 36. The stationary contact 56*c* is connected to the control circuit 34 via the resistor 57.

According to the circuit arrangement of the communication bus disconnect control unit 33 shown in FIG. 4, the instrument panel communication bus group 23 is connected to the control circuit 34 via the resistor 51 when the movable contact 50*a* of the relay switch 50 is switched from the stationary contact 50*b* to the stationary contact 50*c*. Similarly, the door communication bus group 24 is connected to the control circuit 34 via the resistor 57 when the movable contact 56*a* of the relay switch 56 is switched from the stationary contact 56*b* to the stationary contact 56*c*.

With this arrangement, the bus monitor circuit 44 starts monitoring the instrument panel communication bus group 23 when the first bus disconnect circuit 38 is activated in response to the trouble caused in the communication bus 22. Similarly, the bus monitor circuit 45 starts monitoring the door communication bus group 24 when the second bus disconnect circuit 39 is activated in response to the trouble caused in the communication bus 22.

The rest of the second embodiment is identical with that of the first embodiment. The function and effect of the second embodiment are substantially the same as those of the first embodiment.

Third Embodiment

Figure 5:
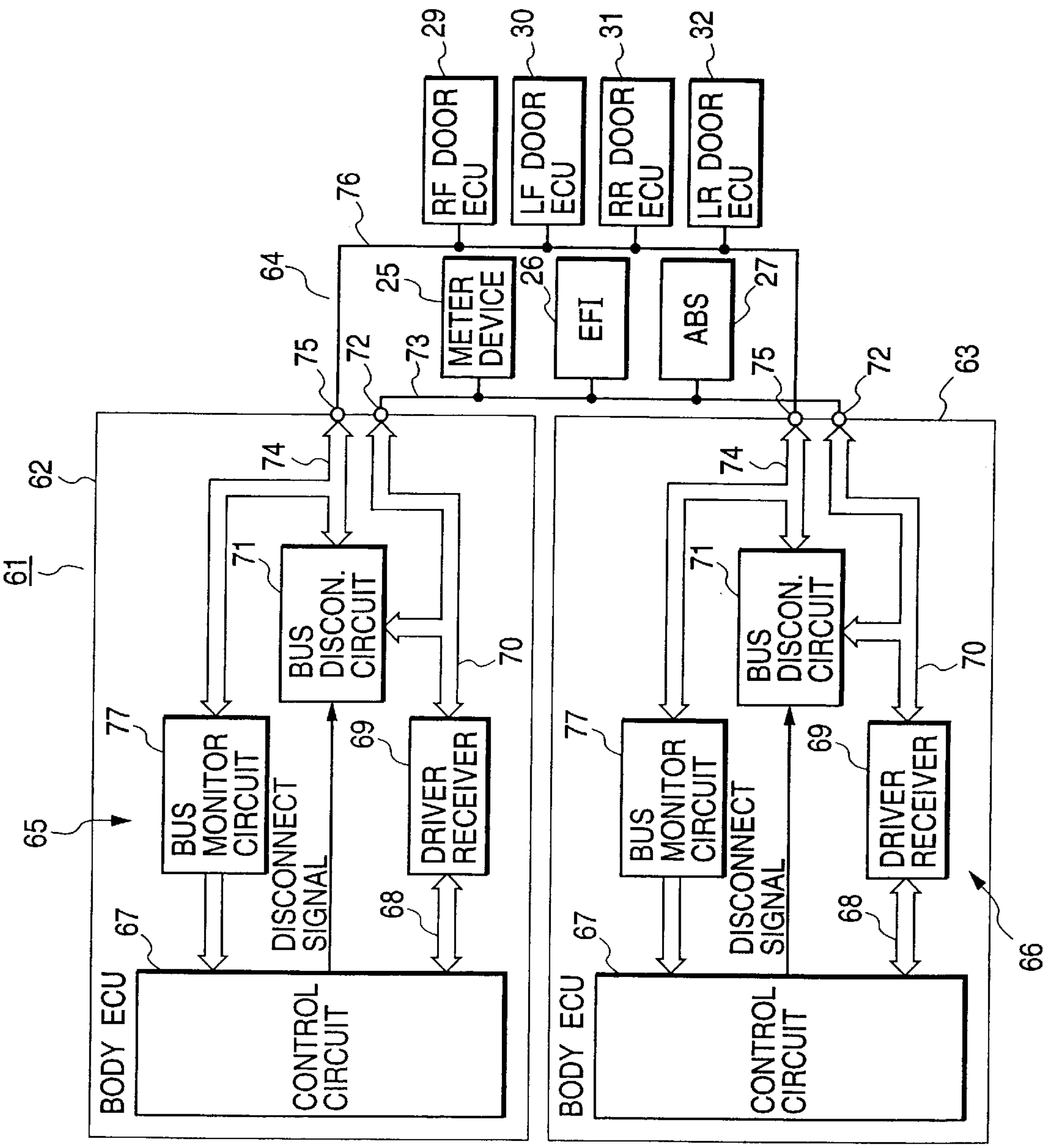
FIG. 5 is a block diagram showing an overall arrangement of a multiplex communication system in accordance with a third embodiment of the present invention.
Figure 6:
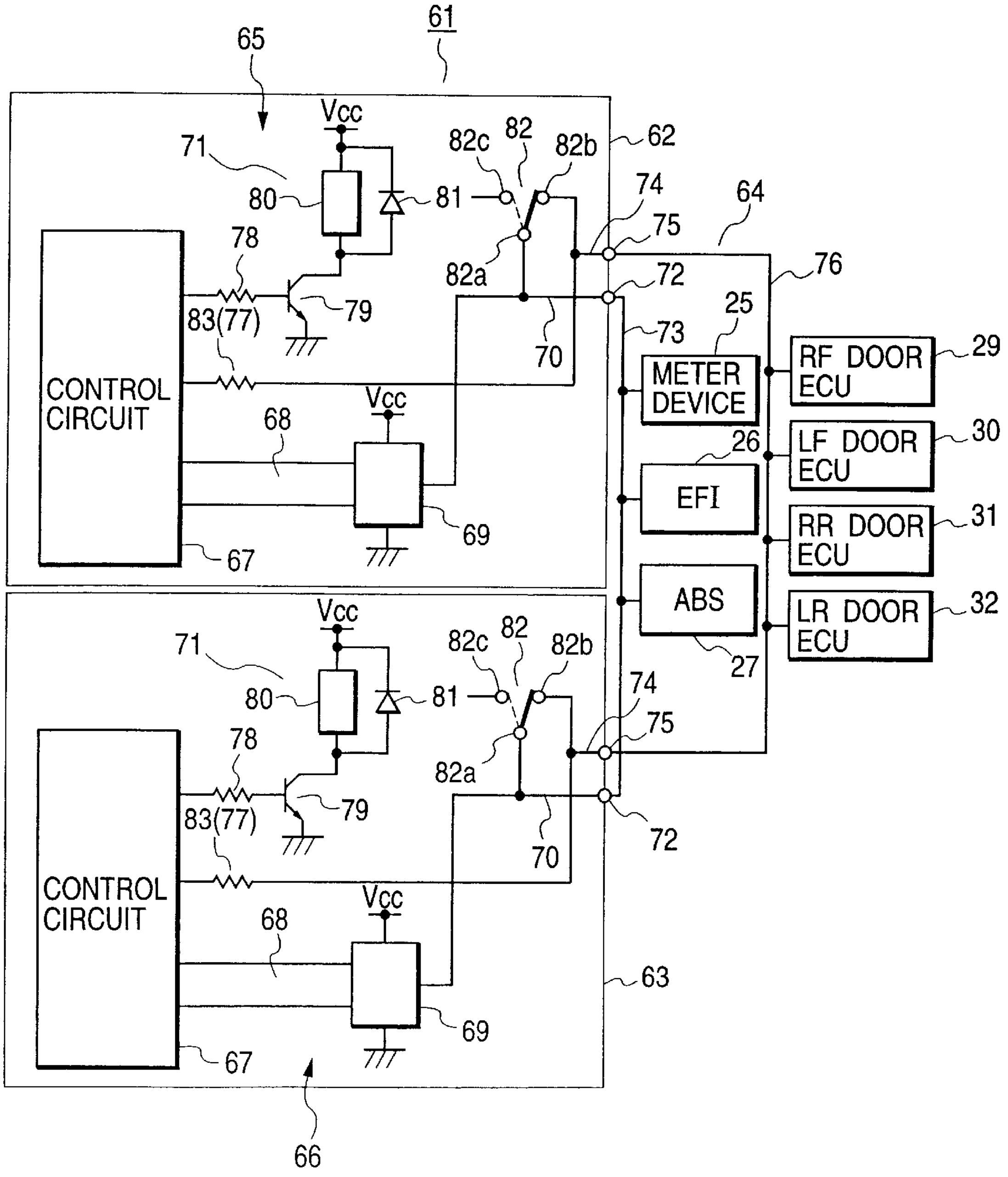
FIG. 6 is a circuit diagram showing a detailed circuit arrangement of the multiplex communication system in accordance with the third embodiment of the present invention.

FIGS. 5 and 6 show a multiplex communication system in accordance with a third embodiment of the present invention. The third embodiment differs from the first embodiment in that the body ECU 28 is divided into a first body ECU 62 and a second body ECU 63 which are respectively connected to a communication bus 64. Furthermore, the communication bus disconnect control unit 33 is divided into a first communication bus disconnect control unit 65 and the second communication bus disconnect control unit 66 which are structurally identical with each other.

Each of the first and second communication bus disconnect control units 65 and 66 comprises a control circuit 67. The control circuit 67 is connected to a driver receiver 69 via a communication line 68. The driver receiver 69 is connected to a bus disconnect circuit 71 and a bus connecting terminal 72 via a communication line 70. The bus connecting terminal 72 is connected to a instrument panel communication bus 73. The bus disconnect circuit 71 is connected to a bus connecting terminal 75 via a communication line 74. The bus connecting terminal 75 is connected to a door communication bus 76.

The above-described meter device 25, EFI 26 and ABS 27 are connected as first group node devices to the instrument panel communication bus 73. The RF door ECU 29, LF door ECU 30, RR door ECU 31 and LR door ECU 32 are connected as second group node devices to the door communication bus 76.

A communication line branching from the communication line 74 is connected to the control circuit 67 via a bus monitor circuit 77. Thus, the control circuit 67 receives the monitoring result of the data transmitted via the communication line 74 between the door communication bus 76 and the bus disconnect circuit 71.

FIG. 6 shows a detailed electric circuit arrangement of the communication bus disconnect control units 65 and 66.

Each of the communication bus disconnect control units 65 and 67 comprises a resistor 78 connected to the control circuit 67, an NPN transistor 79 having a base terminal connected to the resistor 78, a relay coil 80 connected to a collector terminal of the NPN transistor 79, a flywheel diode 81 connected in parallel to the relay coil 80, and a relay switch 82 operable in response to the activation of the relay coil 80.

The relay switch 82 has a movable contact 82*a* connected to the driver receiver 69 and the instrument panel communication bus 73. One stationary contact 82*b* of the relay switch 82 is connected to the door panel communication bus 76 and is also connected to the control circuit 67 via a resistor 83 (functioning as the bus monitor circuit 77 shown in FIG. 5). The relay switch 82 has another stationary contact 82*c* serving as an opened terminal. In a normal condition, the movable contact 82*a* is connected to the stationary contact 82*b* as indicated by a solid line in FIG. 6.

According to the third embodiment, the control circuit 67 checks the data transmitted via the communication lines 68 and 74 and detects any abnormality in the checked data. When any abnormality is detected somewhere in the communication bus 64, the control circuit 67 generates a bus disconnect signal to activate the bus disconnect circuit 71, thereby stopping the data communication with the door communication bus 76 while maintaining the data communication with the instrument panel communication bus 73. In other words, the control circuit 67 can selectively disable the door communication bus 76.

The monitoring operation of the troubled communication bus and the restoring operation of the same can be performed by the bus monitor circuit 77 and the control circuit 67 in the same manner as in the first embodiment. The function and effect of the second embodiment are substantially the same as those of the first embodiment

Fourth Embodiment

Figure 7:
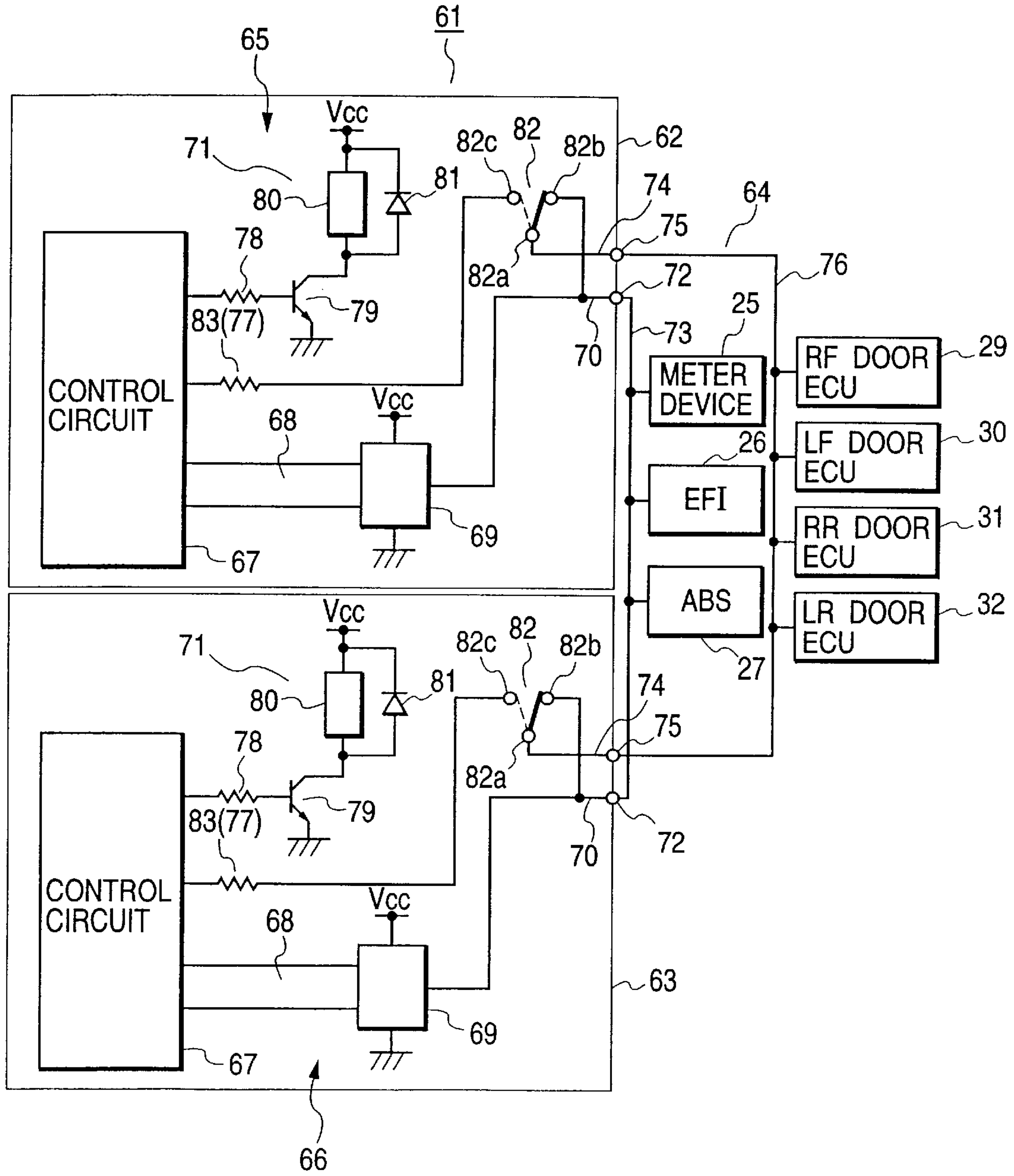
FIG. 7 is a circuit diagram showing a detailed circuit arrangement of a multiplex communication system in accordance with a fourth embodiment of the present invention.

FIG. 7 shows a multiplex communication system in accordance with a fourth embodiment of the present invention.

The fourth embodiment differs from the third embodiment in that the movable contact 82*a* of the relay switch 82 is connected to the door communication bus 76 via the bus connecting terminal 75. The stationary contact 82*b* is connected to the instrument panel communication bus 73 via the bus connecting terminal 72 as well as the driver receiver 69. The stationary contact 82*c* is connected to the control circuit 67 via the resistor 83.

According to the circuit arrangement of the communication bus disconnect control unit 65 or 66 shown in FIG. 7, the door communication bus 76 is connected to the control circuit 67 via the resistor 83 (i.e., bus monitor circuit 77) when the movable contact 82*a* of the relay switch 82 is switched from the stationary contact 82*b* to the stationary contact 82*c*.

With this arrangement, the bus monitor circuit 77 starts monitoring the door communication bus 76 when the bus disconnect circuit 71 is activated in response to the trouble caused in the communication bus 64.

The rest of the fourth embodiment is identical with that of the third embodiment. The function and effect of the fourth embodiment are substantially the same as those of the third embodiment.

Fifth Embodiment

Figure 8:
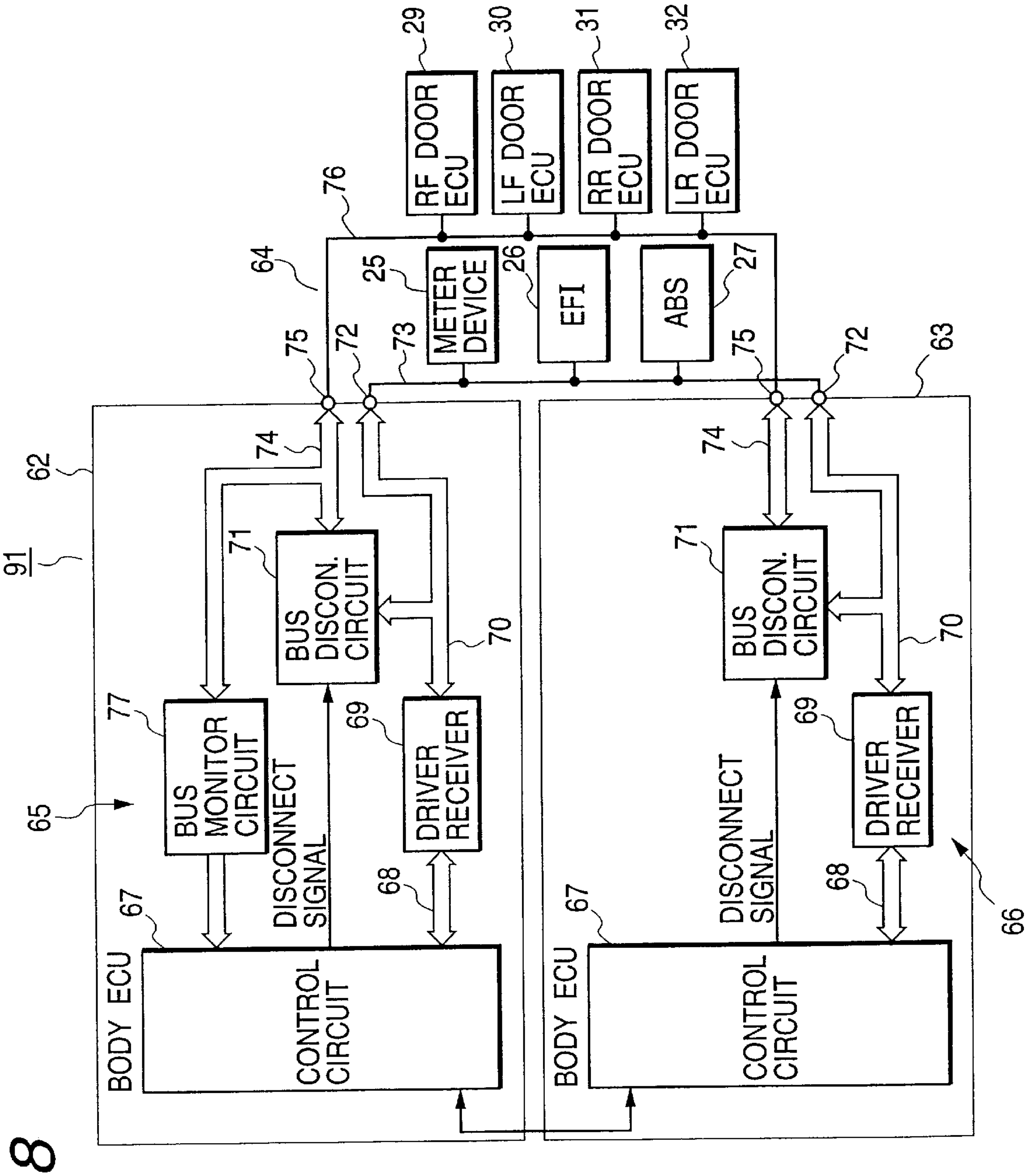
FIG. 8 is a block diagram showing an overall arrangement of a multiplex communication system in accordance with a fifth or sixth embodiment of the present invention.
Figure 9:
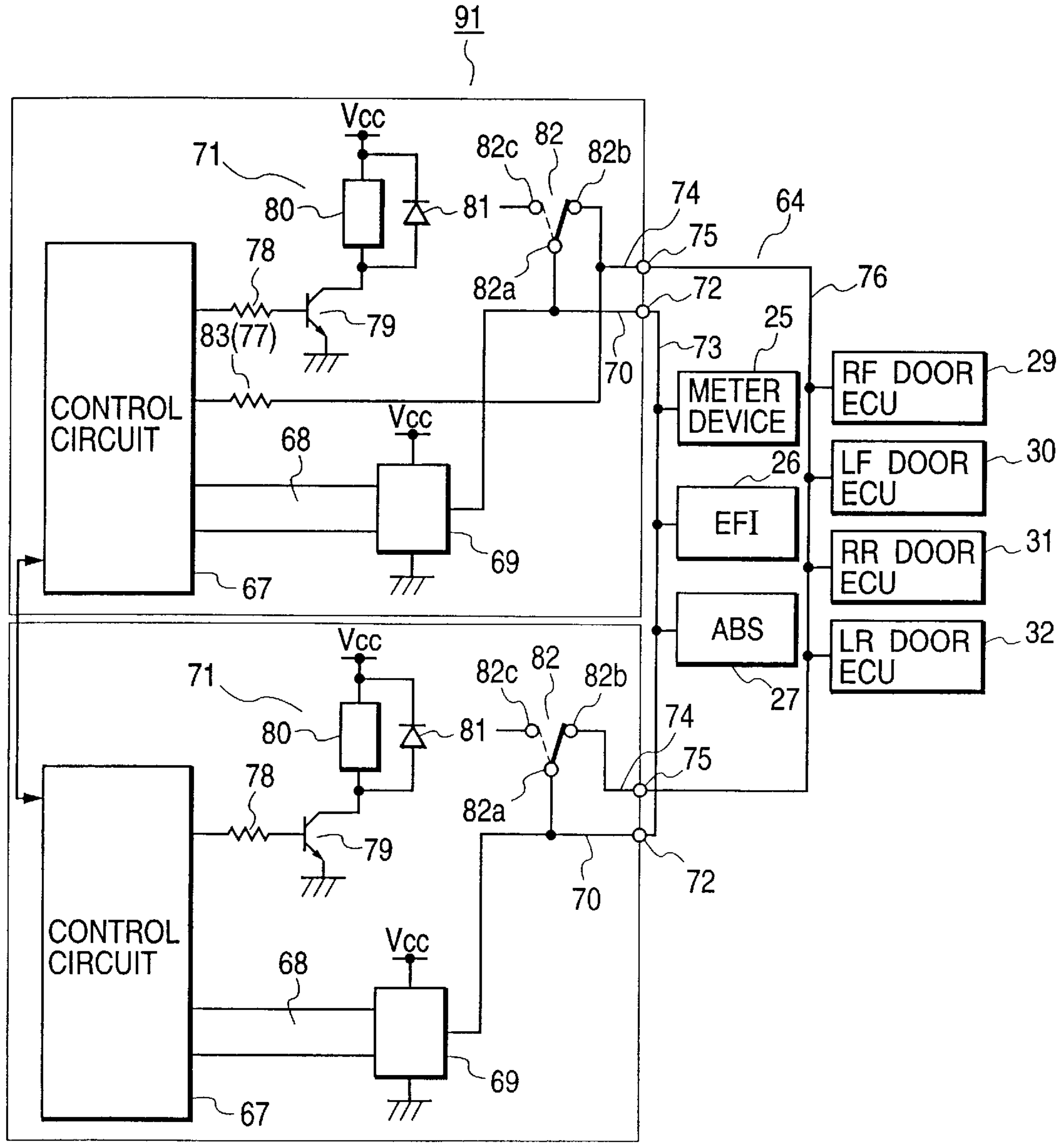
FIG. 9 is a circuit diagram showing a detailed circuit arrangement of the multiplex communication system in accordance with the fifth or sixth embodiment of the present invention.

FIGS. 8 and 9 show a multiplex communication system in accordance with a fifth embodiment of the present invention.

The fifth embodiment differs from the third embodiment in that the bus monitor circuit 77 is provided only one communication bus disconnect control unit 65 in a multiplex communication apparatus 91. Furthermore, the control circuit 67 of the communication bus disconnect control unit 65 is connected to the control circuit 67 of the other communication bus disconnect control unit 66 so as to allow the data communication between them.

According to the fifth embodiment, the communication bus disconnect control unit 65 restores to the original condition in response to a monitoring result of the bus monitor circuit 77. On the other hand, the communication bus disconnect control unit 66 restores to the original condition in response to a notification signal sent from the control circuit 67 of the communication bus disconnect control unit 65.

The rest of the fifth embodiment is identical with that of the third embodiment. The function and effect of the fifth embodiment are substantially the same as those of the third embodiment.

Sixth Embodiment

A sixth embodiment is realized by using the multiplex communication system of the fifth embodiment shown in FIGS. 8 and 9.

According to the six embodiment, the communication bus disconnect control unit 65 restores to the original condition in response to the monitoring result of the bus monitor circuit 77. On the other hand, the communication bus disconnect control unit 66 restores to the original condition based on an analysis on the data (i.e., communication signals) transmitted and received via the communication line 68.

In general, when the abnormality of the communication bus 64 is solved, the data transmission/reception via the communication line 68 can be performed normally. Thus, the control circuit 67 analyzes the condition of the data transmitted or received via the communication line 68, and allows the communication bus disconnect control unit 66 to restore to the original condition based on the result of the data analysis.

The number of separable communication bus groups used in this embodiment is not limited to two. Therefore, the present invention can be applied to the multiplex communication system using three or more communication bus groups.

The bus monitor circuit can be omitted when the monitoring can be performed by checking the operation timing of the ignition key.

The communication bus disconnect control unit is not limited to the body ECU. The communication bus disconnect control unit of the present invention can be installed integrally, or independently, in any other measuring and/or controlling apparatus.

Furthermore, the multiplex communication system of the present invention can be installed in any other vehicles, aircrafts, marine vessels or the like.

This invention may be embodied in several forms without departing from the spirit of essential characteristics thereof. The present embodiments as described are therefore intended to be only illustrative and not restrictive, since the scope of the invention is defined by the appended claims rather than by the description preceding them. All changes that fall within the metes and bounds of the claims, or equivalents of such metes and bounds, are therefore intended to be embraced by the claims.

What is claimed is:

1. A multiplex communication system comprising:

a communication bus; and a communication bus disconnect control device connected to said communication bus;

wherein said communication bus disconnect control device comprises a control means for generating a communication bus disconnect signal when a trouble of said communication bus is detected and a communication bus disconnect means for separating said communication bus into at least two communication bus groups in response to said communication bus disconnect signal;

wherein said communication bus is constituted by a plurality of separable communication bus groups and said communication bus disconnect means selectively disconnects at least one of said plurality of separable communication bus groups in response to said communication bus disconnect signal; and wherein each of said plurality of separable communication bus groups is arranged in a ring pattern; at least one of said plurality of separable communication bus groups is an instrument panel communication bus group including a node connected to a measuring and/or controlling device provided on an instrument panel of an automotive vehicle; at least one of said plurality of separable communication bus groups is a door communication bus group including a node connected to a measuring and/or controlling device installed in a door of the automotive vehicle; and said communication bus disconnect means separates said instrument panel communication bus group and said door communication bus group from each other in response to said communication bus disconnect signal.

2. The multiplex communication system in accordance with claim 1, wherein said communication bus disconnect means selectively disconnects a specific communication bus group in response to said communication bus disconnect signal when said specific communication bus group causes a trouble.

3. The multiplex communication system in accordance with claim 1, wherein said communication bus disconnect control device comprises a communication bus monitor means for monitoring a condition of said communication bus, and said control means stops the operation of said communication bus disconnect means when no abnormality of said communication bus is confirmed by said communication bus monitor means.

4. The multiplex communication system in accordance with claim 3, wherein said communication bus monitor means starts monitoring said communication bus upon activation of said communication bus disconnect means.

5. A multiplex communication system comprising:

a communication bus; and a plurality of communication bus disconnect control devices connected to said communication bus;

wherein each of said communication bus disconnect control devices comprises a control means for generating a communication bus disconnect signal when a trouble of said communication bus is detected and a communication bus disconnect means for separating said communication bus into at least two communication bus groups in response to said communication bus disconnect signal;

wherein said communication bus is constituted by a plurality of separable communication bus groups and said communication bus disconnect means of each communication bus disconnect control device selectively disconnects at least one of said plurality of separable communication bus groups in response to said communication bus disconnect signal; and wherein at least one of said plurality of separable communication bus groups is an instrument panel communication bus group including a node connected to a measuring and/or controlling device provided on an instrument panel of an automotive vehicle; at least one of said plurality of separable communication bus groups is a door communication bus group including a node connected to a measuring and/or controlling device installed in a door of the automotive vehicle; and said communication bus disconnect means of each communication bus disconnect control device separates said instrument panel communication bus group and said door communication bus group from each other in response to said communication bus disconnect signal.

6. The multiplex communication system in accordance with claim 5, wherein said communication bus disconnect means of each communication bus disconnect control device selectively disconnects a specific communication bus group in response to said communication bus disconnect signal when said specific communication bus group causes a trouble.

7. The multiplex communication system in accordance with claim 6, wherein each of said communication bus disconnect control devices comprises a communication bus monitor means for monitoring a condition of said communication bus, and said control means of each communication bus disconnect control device stops the operation of the corresponding communication bus disconnect means when no abnormality of said communication bus is confirmed by said communication bus monitor means.

8. The multiplex communication system in accordance with claim 7, wherein said communication bus monitor means starts monitoring said communication bus upon activation of said corresponding communication bus disconnect means.

9. The multiplex communication system in accordance with claim 5, wherein a communication bus monitor means for monitoring a condition of said communication bus is provided in a designated communication bus disconnect control device selected from said plurality of communication bus disconnect control devices, said control means of said designated communication bus disconnect control device not only stops the operation of the corresponding communication bus disconnect means but also generates a notification signal when no abnormality of said communication bus is confirmed by said communication bus monitor means, and said control means of other communication bus disconnect control device stops the operation of the corresponding communication bus disconnect means in response to said notification signal sent from said control means of said designated communication bus disconnect control device.

10. The multiplex communication system in accordance with claim 9, wherein said communication bus monitor means starts monitoring said communication bus upon activation of said communication bus disconnect means in said designated communication bus disconnect control device.

11. The multiplex communication system in accordance with claim 5, wherein a communication bus monitor means for monitoring a condition of said communication bus is provided in a designated communication bus disconnect control device selected from said plurality of communication bus disconnect control devices, said control means of said designated communication bus disconnect control device stops the operation of the corresponding communication bus disconnect means when no abnormality of said communication bus is confirmed by said communication bus monitor means, and said control means of other communication bus disconnect control device stops the operation of the corresponding communication bus disconnect means based on an analysis on communication signals transmitted from said communication bus.

12. The multiplex communication system in accordance with claim 11, wherein said communication bus monitor means starts monitoring said communication bus upon activation of said communication bus disconnect means in said designated communication bus disconnect control device.

* * * * *